US009147377B2

(12) United States Patent
Chen et al.

(10) Patent No.: US 9,147,377 B2
(45) Date of Patent: Sep. 29, 2015

(54) METHOD FOR IMAGE DITHERING FOR LITHOGRAPHIC PROCESSES

(71) Applicant: Taiwan Semiconductor Manufacturing Company, Ltd., Hsin-Chu (TW)

(72) Inventors: Cheng-Hung Chen, Zhubei (TW); Shy-Jay Shin, Jhudong Township (TW); Jaw-Jung Shin, Hsinchu (TW); Burn Jeng Lin, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/956,267

(22) Filed: Jul. 31, 2013

(65) Prior Publication Data

US 2015/0035851 A1 Feb. 5, 2015

(51) Int. Cl.
*G09G 5/02* (2006.01)

(52) U.S. Cl.
CPC ........................................ *G09G 5/02* (2013.01)

(58) Field of Classification Search
CPC ........................................................ G09G 5/02
USPC ......... 358/3.13; 382/916, 141, 144, 145, 151; 716/50, 52, 53, 55
See application file for complete search history.

(56) References Cited

U.S. PATENT DOCUMENTS

| | | | | |
|---|---|---|---|---|
| 2005/0216877 | A1 * | 9/2005 | Pack et al. | 716/19 |
| 2007/0172145 | A1 * | 7/2007 | Altunbasak et al. | 382/274 |
| 2010/0220362 | A1 * | 9/2010 | Shepherd et al. | 358/3.06 |
| 2012/0050815 | A1 * | 3/2012 | Kodama et al. | 358/3.03 |

OTHER PUBLICATIONS

Xin Li, "Edge-Directed Error Diffusion Halftoning," IEEE Signal Processing Letters, vol. 13, No. 11, Nov. 2006, pp. 688-690.

Burn Lin, "The Exposure-Defocus Forest", Japanese Journal of Applied Physics, vol. 33, Issue 12B, pp. 6756-6764 (1994).

* cited by examiner

*Primary Examiner* — Qian Yang
(74) *Attorney, Agent, or Firm* — Haynes and Boone, LLP

(57) ABSTRACT

The present disclosure provides a method for image dithering. The method includes providing a polygon related to an integrated circuit (IC) layout design in a graphic database system (GDS) grid; converting the polygon to an intensity map in the GDS grid, the intensity map including a group of partial pixels and a group of full pixels; performing a first quantization process to a partial pixel to determine a first error; applying the first error to one or more full pixels; performing a second quantization process to a full pixel to determine a second error; and distributing the second error to one or more full pixels. The partial pixels correspond to pixels partially covered by the polygon, and the full pixels correspond to pixels fully covered by the polygon.

20 Claims, 5 Drawing Sheets

METHOD FOR IMAGE DITHERING FOR LITHOGRAPHIC PROCESSES

BACKGROUND

The semiconductor industry has experienced exponential growth. Continuous advancements in lithographic resolution have been made to support critical dimensions (CDs) of 90 nm to 65 nm, 45 nm, 32 nm, 22 nm, 16 nm and beyond. New techniques in lithography have been developed, such as immersion lithography, multiple patterning, extreme ultra-violet (EUV) lithography and e-beam lithography.

Dither is a well-known form of noise used to randomize quantization error, and error diffusion is one of the most popular algorithms to perform dithering. Error diffusion dithering is generally used to randomize quantization error for displaying or printing on substrates in various fields, such as electron beam lithography.

Current image dithering and error diffusion algorithms are mostly focused on minimizing visual artifacts. With the increase in integration density and the reduction in dimension of the integrated circuit (IC) devices, current methods have not been satisfactory in all respects. Therefore there is a need for an image dithering method to improve CD uniformity and to enlarge the process window of lithography processes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
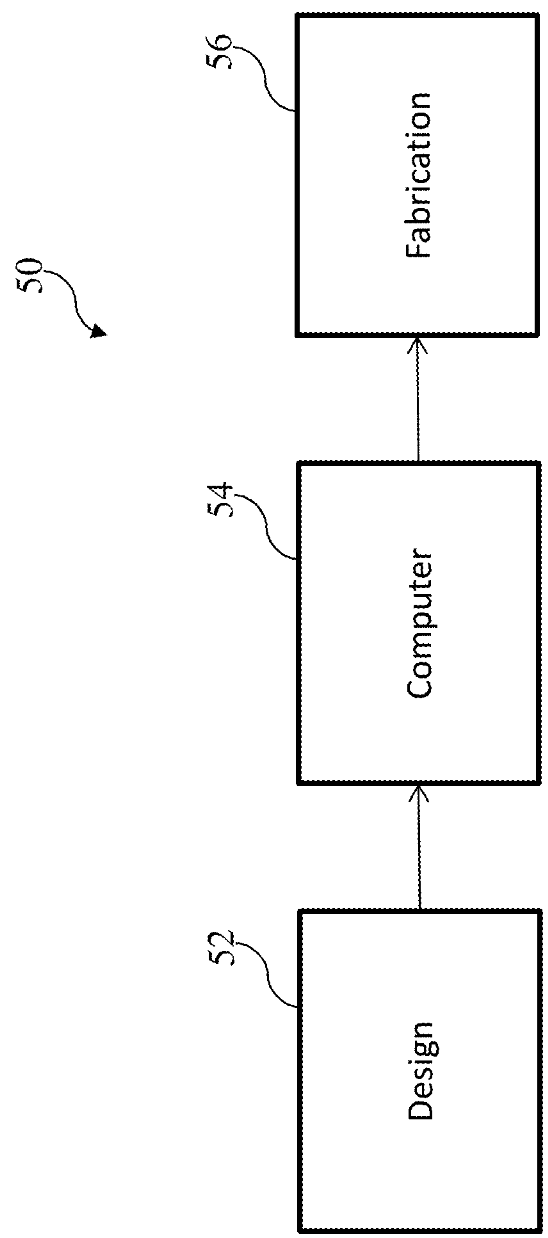
FIG. 1 is a block diagram of a system in which various embodiments of the present disclosure may be implemented.

FIG. 1 illustrates a system 50 in which one or more embodiments of the present invention may be implemented. The system 50 includes a design entity 52 that includes one or more computers and storage media for providing an integrated circuit (IC) layout design. The IC layout design may contain a plurality of semiconductor features. The IC layout design may be generated by a computer as a computer file, for example as a graphic database system (GDS) type file or as an open artwork system interchange standard (OASIS) type file. The GDS or OASIS files are database files used for data exchange of IC layout artwork. For example, these files may have binary file formats for representing planar geometric shapes, text labels, as well as other layout information of the IC layout. The GDS or OASIS files may each contain multiple layers. The GDS or OASIS files may be used to reconstruct the IC layout artwork, and as such can be transferred or shared between various fabrication tools.

The design entity provides the graphical IC layout design as a computer file to a computer 54. The computer 54 includes a processor, memory, and input/output with which to perform the steps and operations discussed later in the present disclosure. The computer 54 can be distributed in various locations, and can physically be included in whole or in part with the design entity 52 or a different facility such as a fabrication facility 56 discussed below. The computer file including the graphical IC layout design may be stored in a computer readable media on the computer 54. Some common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read.

The computer 54 performs operations on the graphical IC layout design, and then provides the result of such operations to the fabrication facility 56. In the present example, the fabrication facility 56 supports a lithography process to be performed in a semiconductor processing-related facility. The fabrication facility can be a mask-making facility, an engineering facility, or part of a lithography system itself.

Figure 2:
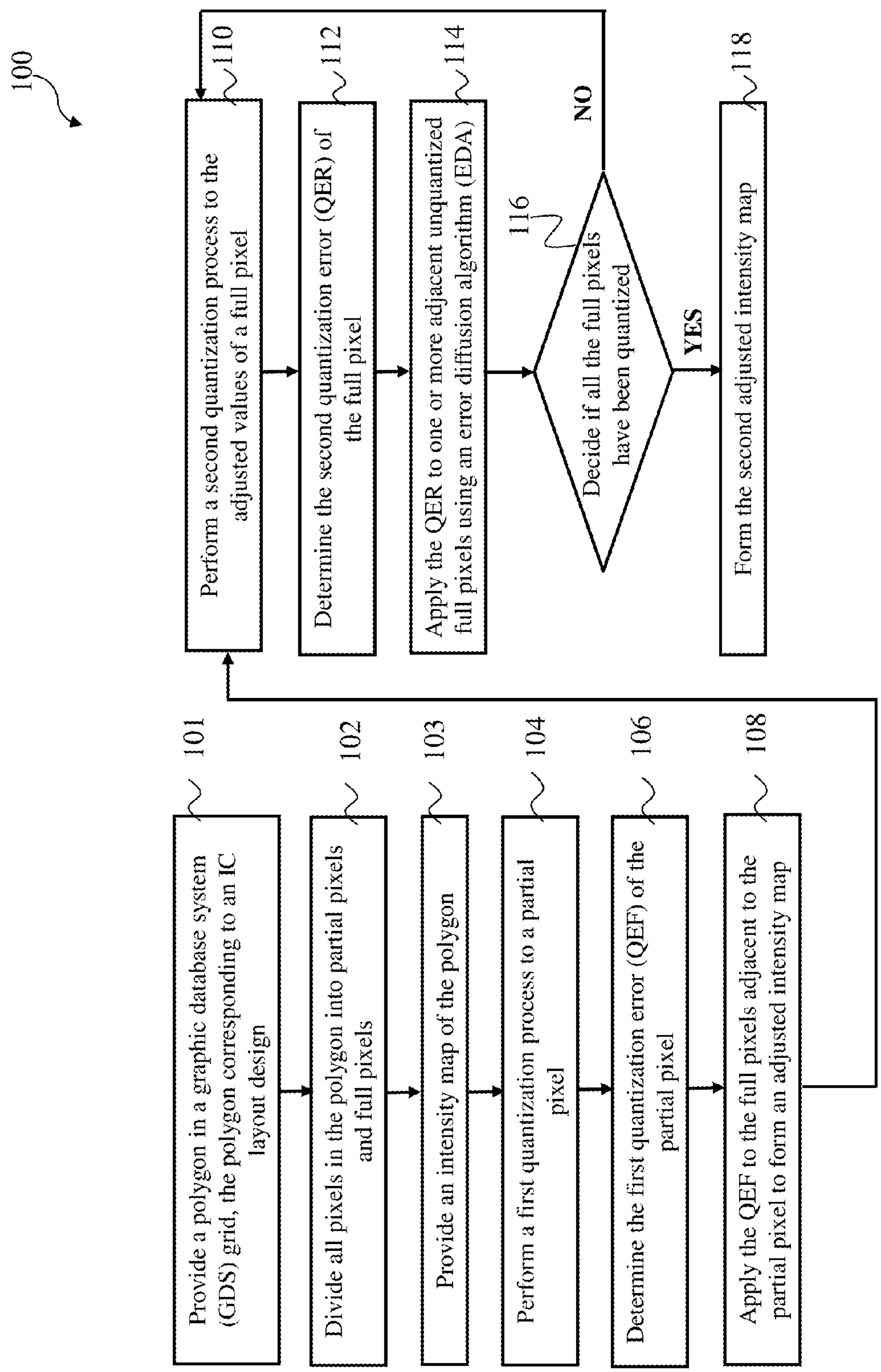
FIG. 2 is a flowchart of an example method of an image dithering process including an error diffusion method according to various embodiments of the present disclosure.

FIG. 2 is a flow chart of a method 100 of an image dithering process according to various embodiments, and described as being used with a lithography process. The method 100 can be performed by the computer 54 (FIG. 1). In some embodiments, the dithering process may be performed during an e-beam lithography process. The dithering process may be used for controlling the beam intensity. In some embodiments, method 100 of the image dithering process may be also applied in the field of computer graphs processing.

Figures 3A, 3B:
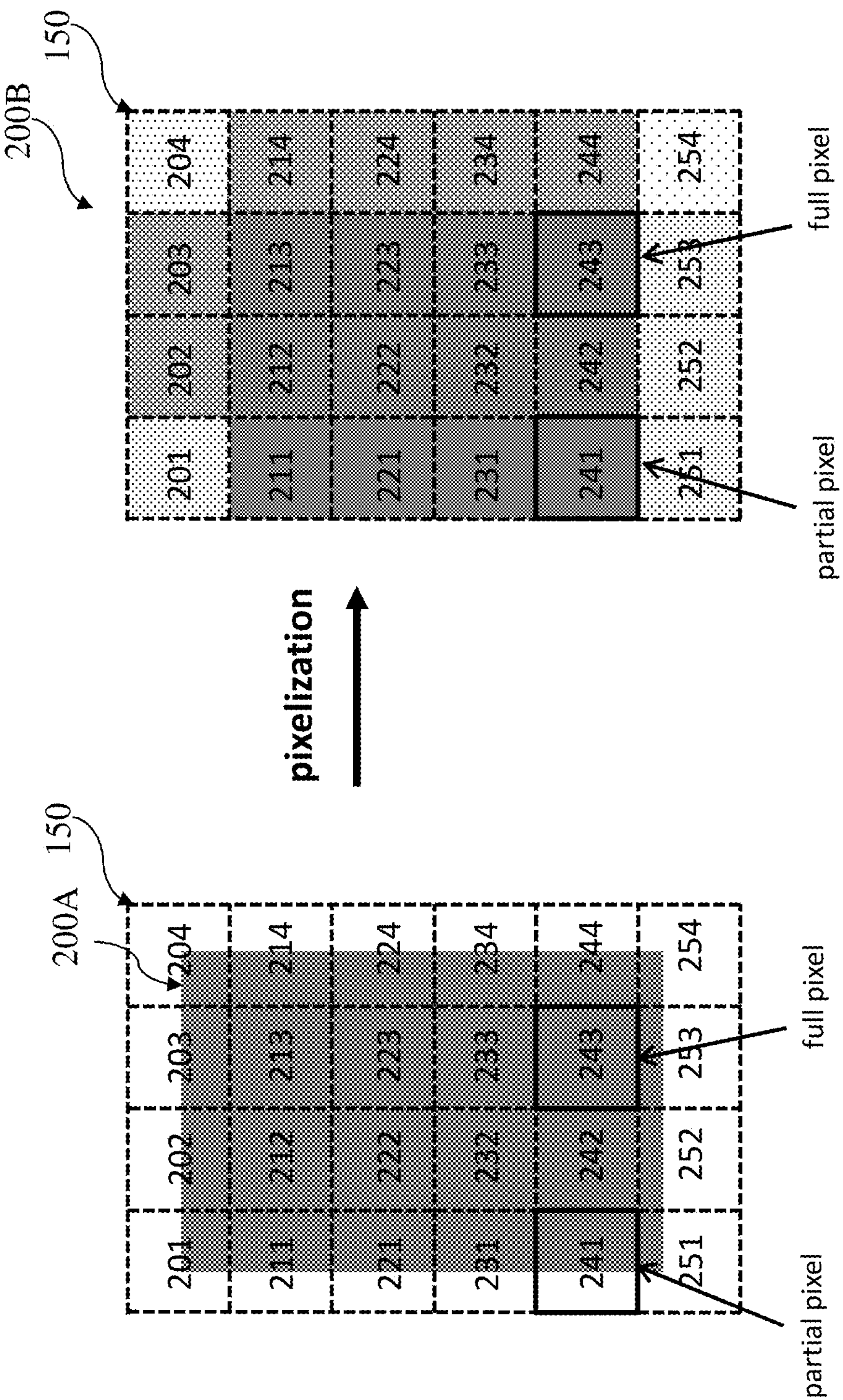
FIGS. 3A-3B, 5 and 7 are simplified schematic diagrams of an image map at various stages of the image dithering process including an error diffusion method according to the method of FIG. 2.

Referring to FIGS. 2 and 3A, method 100 begins at step 101 by providing a polygon 200A in a graphic database system (GDS) grid 150 corresponding to the IC layout design. In some embodiments, IC layout design GDS grid 150 may be a machine-specific exposure grid, so that GDS grid 150 can be implemented by a lithography machine. A lithography exposure process sweeps across the entire surface of a substrate to be patterned, pixel by pixel (or pixels by pixels). A proximity correction process may also be applied to the GDS grid 150. The proximity correction process is a lithography enhancement technique that can be used to compensate for image errors due to process defects. For example, electron scattering during the performance of a maskless lithography process may adversely impact regions of the substrate near the region that is being exposed by the electron beams. Consequently, these nearby regions may become inadvertently exposed, thereby causing variations of the desired exposure pattern. To compensate for these image errors, proximity correction techniques such as dose modification, shape modification, or background correction exposure may be employed in a maskless lithography process. The performance of the proximity correction process in the GDS grid 150 makes the fabricated semiconductor feature patterns resemble the desired patterns more accurately.

Still referring to FIG. 3A, in some embodiments, polygon 200A may include more than one logic section with various sizes. The sizes may refer to physical dimensions of the circuit sections in polygon 200A, or the amount of data that is stored within each circuit section. GDS grid 150 includes a two-dimensional array of pixels, such as 201-204 . . . 251-254. Pixels are often represented using dots or squares in a coordinate system. Each pixel has an exposure intensity value (represented by a digital number) and a location address (corresponding to its coordinates).

Referring to FIGS. 2 and 3A, method 100 proceeds to step 102 by dividing all pixels in the polygon 200A into two types: full pixels and partial pixels. Polygon 200A is disposed on GDS grid 150. In some embodiments, due to various sizes of IC layout design, the boundaries of polygon 200A may not align with boundaries of the pixels of GDS grid 150 in some locations, as shown in FIG. 3A. Therefore, pixels in GDS grid 150 overlapping with polygon 200A may be categorized into two types: partial pixels and full pixels. Partial pixels refer to the pixels in GDS grid 150 covered partially by polygon 200A, such as pixels 201, 202, 203, 204, 211, 214, 221, 224, 231, 234, 241, 244, 251, 252, 253, and 254 in FIG. 3A. Full pixels refer to the pixels in GDS grid 150 covered entirely by polygon 200A, such as pixels 212, 213, 222, 223, 232, 233, 242, and 243. Partial pixels and full pixels may be identified by the computer 54 at step 102. For example, the computer 54 may calculate the percentage of the polygon 200A overlaps with a corresponding pixel on the GDS grid 150. When the coverage of the corresponding pixel (e.g., pixel 212) is about 100%, the corresponding pixel (e.g., pixel 212) may be categorized as a full pixel. When the coverage of the corresponding pixel (e.g., pixel 211) is less than 100%, the corresponding pixel (e.g., pixel 211) may be categorized as a partial pixel. In some embodiments, the partial pixels may be also identified by a standard edge detector.

Referring to FIGS. 2 and 3A-3B, method 100 proceeds to step 103 by providing an intensity map 200B from polygon 200A in the graphic database system (GDS) gird 150. Intensity map 200B in a simplified GDS grid 150 corresponding to an IC design layout is illustrated in a coordinate system. Intensity map 200B may be formed by calculating the ratio of the area covered by polygon 200A in each pixel. The ratio of the covered area may be then represented by a grey scale value representing the exposure intensity as shown in FIG. 3B. In some embodiments, full pixels may be filled with the maximum grey scale, for example, for full pixel 243, the grey scale may be set to the maximum value (black). The grey scale for partial pixels may be adjusted in proportion to the ratio of the covered area.

Figure 5:
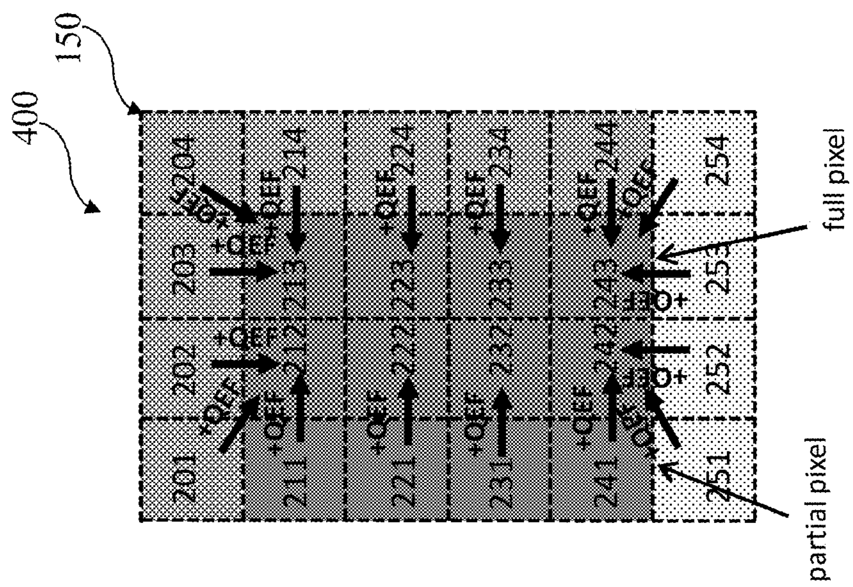
Figure 4:
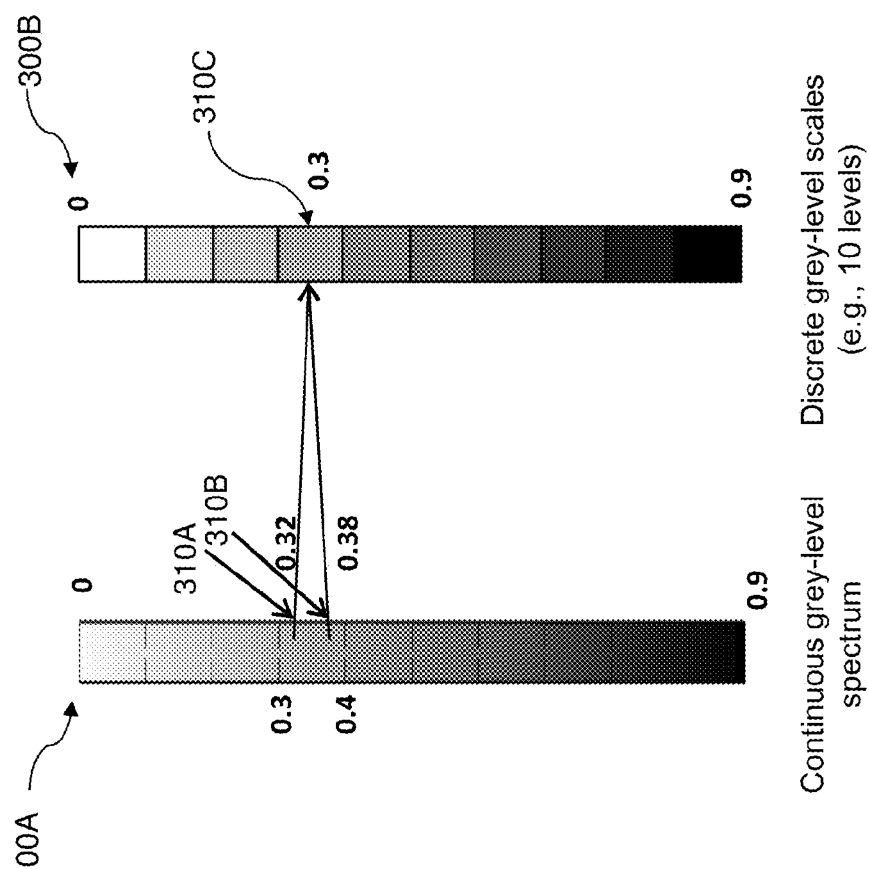
FIG. 4 is a simplified schematic diagram illustrating converting a grey level value from a continuous grey-level spectrum to discrete grey-level scales using a first quantization process according to some embodiments of the present disclosure.

Referring to FIGS. 2, 4 and 5, method 100 proceeds to step 104 by performing a first quantization process to a partial pixel of intensity map 200B. Each partial pixel in intensity map 200B may have a grey-level value corresponding to the area covered by the partial pixel in GDS grid 150. The grey-level value of each partial pixel may be a certain continuous grey-level value $x_p(i)$ (e.g., 310A and 310B) in a continuous grey-level spectrum 300A, where $x_p(i)$ is the continuous grey-level value of a partial pixel with a coordination number i. In order to implement GDS grid 150 with a grey-level value using a lithography machine, and/or in order to use a grey-level value that can be processed by a computer, the continuous grey-level value $x_p(i)$ (e.g., 310A, 310B) may be quantized to a corresponding discrete grey-level value $Q(x_p(i))$ (e.g., 310C) in a discrete grey-level scales 300B. After the quantization process, the discrete grey-level value $Q(x_p(i))$ may correspond to a lithography exposure intensity value that is implementable by a lithography machine.

Referring to FIG. 4, a maximum exposure dose of the discrete grey-level scales 300B is usually set to be the same as the dose used for the black color pixel, and the minimum exposure dose of the discrete grey-level scales 300B is usually set to be the same as the one used for the white color pixel, or vice versa. The exposure dose intensity (grey level) delivered to each pixel is controlled by a quantization state of data bits stored in GDS grid 150. When n bits are used, there are $2^n$ grey levels in total in the discrete grey-level scales 300B, from a grey level zero (white color), to a grey level $2^n-1$ (black color). For example, if 6 bits are used, a total of 64 grey levels, from a grey level zero (white color) to a grey level 63 (black color), are established in the discrete grey-level scales 300B. The number of divided levels in the discrete grey-level scales 300B may reflect the similarity of the image before and after the quantization process. For example, the more divided levels the discrete grey-level scales 300B have, the closer the quantized image based on the discrete grey-level scales 300B are to the image based on continuous grey-level spectrum 300A. However with a large numbers of divided levels in the discrete grey-level scales 300B, the more bits are used, the large data volume will have to be stored and computed during data processing, or in the downstream processes.

Still referring to FIG. 4, each partial pixel with a continuous grey-level value $x_p(i)$ may be quantized to a corresponding discrete grey-level value $Q(x_p(i))$ using a first quantization process. In some embodiments, the first quantization process may be a floor process (F). During the floor process, a continuous grey-level value $x_p(i)$ from the continuous grey-level spectrum 300A may be converted into a floored grey-level value $F(x_p(i))$, which is the largest scale number on the discrete grey-level scales 300B, but is not greater than the continuous grey-level value. For example, discrete grey-level scales 300B have 10 grey levels from 0 to 0.9, as shown in FIG. 4. A continuous grey-level value 310A (0.32) and 310B (0.38) may be both floored to a discrete grey-level value 310C (0.3). All the partial pixels in the intensity map 200B may be performed using the floor process.

Referring to FIGS. 2 and 4, method 100 proceeds to step 106 by determining a first quantization error. In some embodiments when the first quantization process includes a floor process, the first quantization error is referred to as quantization error by floor (QEF). QEF may be induced when quantizing a continuous grey-level value $x_p(i)$ to a discrete grey-level value $F(x_p(i))$ during the floor process. For example, in the continuous grey-level spectrum 300A, all different continuous grey-level values equal to or greater than 0.3 and smaller than 0.4 are converted to the discrete grey-level value 0.3 (310C) in the discrete grey-level scales 300B. In some embodiments, QEF may be calculated as the difference between the continuous grey-level value and the floored grey-level value, as shown in equation 1 below:

$$QEF(i)=x_p(i)-F(x_p(i)) \quad (1)$$

where $x_p(i)$ is the continuous grey-level value of a partial pixel with a coordination number i, and $F(x_p(i))$ is the discrete grey-level by the floor process. For example, QEF(310A) for the floor process from the continuous grey-level value $x_p$(310A)=0.32 to the floored discrete grey-level value $F(x_p$(310A)=0.3 equals 0.02. The QEF(310B) for the floor process from the continuous grey-level value $x_p$(310B)=0.38 to the floored discrete grey-level value $F(x_p$(310B)=0.3 equals 0.08. QEFs of all the partial pixels may be calculated as discussed above.

Referring to FIGS. 2 and 5, method 100 proceeds to step 108 by applying the QEF of a partial pixel to the full pixels adjacent to the partial pixel to form a first adjusted intensity map 400. During the formation of the first adjusted intensity map 400, QEF calculated from the floor process of a partial pixel may be added to the continuous grey-level value of its neighboring full pixel(s) to form an adjusted grey-level value of the corresponding full pixel, as shown in equation 2 below:

$$u_f(j)=x_f(j)+QEF(i) \quad (2)$$

where $u_f(j)$ is an adjusted grey-level value of a full pixel j adjacent to the partial pixel i, and $x_f(j)$ is the continuous grey-level value of a full pixel j. For example, the QEF(211) calculated from the floor process of partial pixel 211 may be added to the neighboring full pixel 212 to form the adjusted grey-level value u(212).

Referring to FIG. 5, a full pixel may have more than one neighboring partial pixels, thus QEFs from more than one partial pixel may be added to a full pixel. For example as shown in FIG. 5, QEFs of partial pixels 201, 202 and 211 may be added to full pixel 212, as shown in equation 3 below:

$$u_f(212)=x_f(212)+QEF(201)+QEF(202)+QEF(211) \quad (3)$$

In some embodiments, the QEF of a partial pixel may be added to more than the nearest full pixel, such as the second and/or the third nearest pixels. In some examples, a portion of the QEF may be added to the nearest full pixel, and another portion of the QEF may be added to the second nearest full pixel. In some embodiments, the QEF of a partial pixel may be divided into multiple portions, and added to multiple full pixels individually. Intensity map 200B may be adjusted by adding the QEF from one or more neighboring partial pixels to each full pixel to form the first adjusted intensity map 400. All the partial pixels may be processed using the processes as discussed in steps 104 to 108 to form a first adjusted intensity map 400 in GDS grid 150. Each adjusted full pixels in the first adjusted intensity map 400 has an adjusted grey-level value $u_f(j)$.

Figure 7:
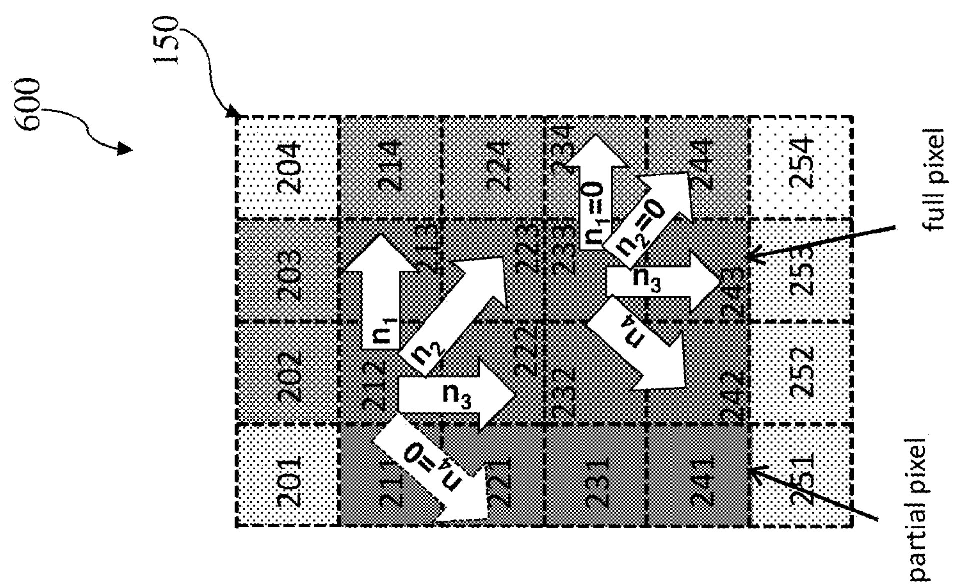
Figure 6:
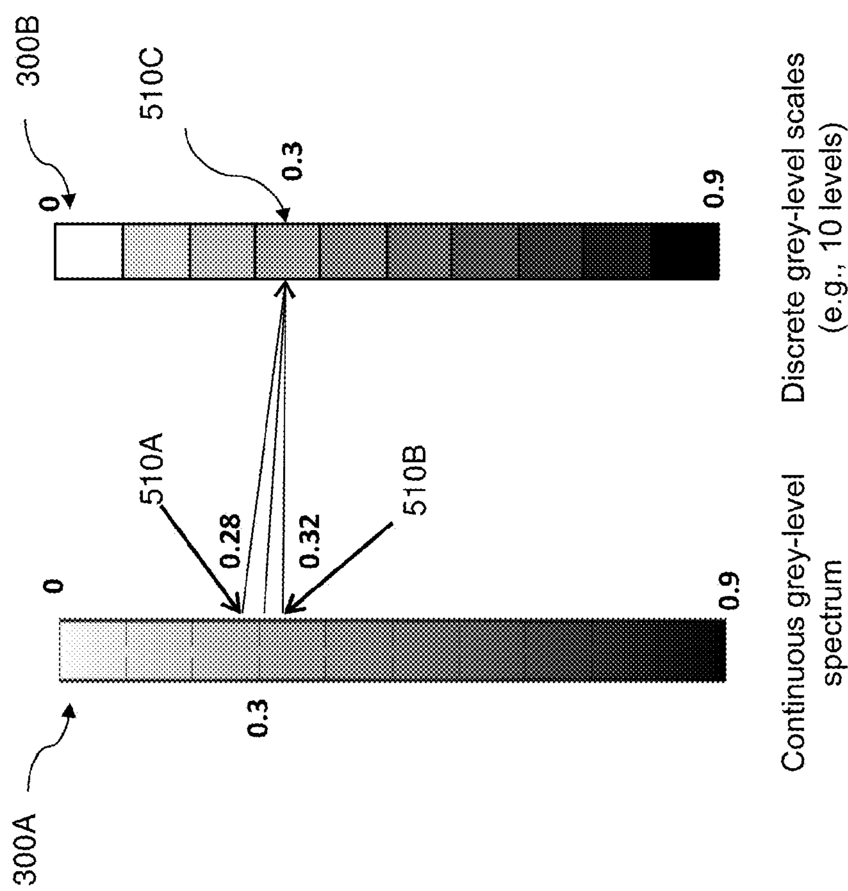
FIG. 6 is a simplified schematic diagram illustrating converting a grey level value from a continuous grey-level spectrum to discrete grey-level scales using a second quantization process according to some embodiments of the present disclosure.

Referring to FIGS. 2 and 6, method 100 proceeds to step 110 by performing a second quantization process to the adjusted values $u_f(j)$ of a full pixel j in the first adjusted intensity map 400 to receive a corresponding discrete grey-level value $Q(u_f(j))$. In some embodiments, when a full pixel was not adjusted using the QEF of a partial pixel in step 108, the adjusted values $u_f(j)$ may use the continuous grey-level value $x_f(j)$ during the second quantization process. Referring to FIG. 5, the second quantization process may convert an adjusted grey-level value $u_f(j)$ (e.g., 510A and 510B) in the continuous grey-level spectrum 300A to a corresponding discrete grey-level value $Q(u_f(j))$ (e.g., 510C) in the discrete grey-level scales 300B, as shown in FIG. 6. In some embodiments, the quantization process may be a rounding process. During the rounding process, an adjusted grey-level value $u_f(j)$ may be converted into the closest scale number on the discrete grey-level scales 300B, which has a shorter form or more explicit representation than the continuous grey-level value. The rounded grey-level number is represented by $R(u_f(j))$. For example, as shown in FIG. 6, a grey-level value 0.28 (510A) and 0.32 (510B) in the continuous grey-level spectrum 300A may be both rounded to a discrete grey-level value 0.3 (510C) in the discrete grey-level scales 300B. In some embodiments, step 110 may start from the upper left full pixel among all full pixels, such as pixel 212 as shown in FIG. 7.

Referring to FIGS. 2 and 6, method 100 proceeds to step 112 by determining a second quantization error. In some embodiments when the second quantization process includes a rounding process, the second quantization error is referred to as quantization error by rounding (QER). QER may be induced when quantizing the adjusted grey-level value to a discrete grey-level value during the rounding process. For example, in the continuous grey-level spectrum 300A, all different grey-level values between the level 510A and 510B may be converted to the discrete grey-level value 510C in the discrete grey-level scales 300B. A QER of a full pixel j may be calculated as the difference between the adjusted grey-level value $u_f(j)$ and the corresponding discrete grey-level value $R(u_f(j))$, as shown in equation 4 below:

$$QER(j)=u_f(j)-R(u_f(j)) \quad (4)$$

where $u_f(j)$ is the adjusted grey-level value of a full pixel with a coordination number j, and $R(u_f(j))$ is the discrete grey-level by the rounding process. For example, QER for the rounding process from the continuous grey-level value 510A (0.28) to the discrete grey-level value 510C (0.3) equals −0.02. The QER for the floor process from the continuous grey-level value 510B (0.32) to the discrete grey-level value 510C (0.3) equals 0.02.

Referring to FIGS. 2 and 7, method 100 proceeds to step 114 by applying QER to one or more full pixels using an error diffusion algorithm (EDA). In some embodiments, the error diffusion algorithm may include dithering by diffusing the quantization error (such as QER) of a full pixel to its one or more neighboring full pixels. In some embodiments, the EDA may be only performed to one or more neighboring full pixels, whereas EDA is not performed to any of the partial pixels. In some embodiments, the EDA may be only performed to the neighboring full pixels that have not been treated with the second quantization process (unquantized full pixels).

Referring to FIG. 7 for example, when the EDA is applied to a current full pixel j=212 that is being quantized, QER(212) may be calculated using equation 4, and QER(212) may be divided using a divisor N(212), where N(212)=$n_1+n_2+n_3+n_4$, and where $n_1/N(j)$ of the error (e.g., QER) gets allocated to the full pixel (e.g., pixel 213) immediately to the right of the current full pixel being quantized, $n_2/N(j)$ of the error gets diffused to the full pixel (e.g., pixel 223) immediately to the right and directly below the current full pixel (e.g., pixel 212) being quantized, $n_3/N$ of the error gets diffused to the full pixel (e.g., pixel 222) directly below the current full pixel (e.g., pixel 212) being quantized. In the present EDA, $n_4/N$ of the error is supposed to diffuse to the full pixel immediately to the left and directly below the current full pixel (e.g., pixel 212) being quantized. In some embodiments, $n_1$ is selected to be 7, $n_2$ is selected to be 1, $n_3$ is selected to be 5, and $n_4$ is selected to be 3. However when a neighboring pixel of a certain direction of the current full pixel is a partial pixel, the corresponding factor n is changed to 0. For example as shown in FIG. 7, the pixel (e.g., pixel 221) immediately to the left and directly below the current full pixel (e.g., pixel 212) is a partial pixel, therefore $n_4$ is 0. Thus the divisor N(212) for the full pixel 212 can be calculated as N(212)=7+1+5+0=13.

In some embodiments, the EDA(j) of a current full pixel j being quantized may be illustrated using equation 5 as below:

$$EDA(j)=h(j)\cdot QER(j) \quad (5)$$

where EDA(j) represents the error diffusion algorithm (EDA) performed using the quantization error by rounding QER(j) to all the neighboring pixels of pixel j, and where h(j) represents the error diffusion factor that can be shown in equation 6 as below:

$$h(j)=[n_1,n_2,n_3,n_4]/N(j) \quad (6)$$

where $n_1$, $n_2$, $n_3$ or $n_4$ equals to 0 when the pixel in the corresponding direction is a partial pixel.

Each full pixel may have a neighboring environment different from each other, for example each full pixel may have a different number of available neighboring full pixels from each other. Thus the divisor N and EDA of the full pixel being quantized may be different from each other. For example, the current full pixel is pixel 212, and a QER(212) of pixel 212 has been calculated as discussed in equation 4 in step 112. The divisor N(212) for pixel 212 can be calculated as $N_{212}$=7+5+1=13 as discussed above. In the EDA (212), the pixel (pixel 213) immediately to the right of pixel 212 gets 7/13 of QER (212), the pixel (pixel 222) directly below pixel 212 gets 5/13 of QER(212), the pixel (pixel 223) immediately to the right and directly below pixel 212 gets 1/13 of QER(212). In another example, the current full pixel is pixel 233, and a QER(233) of pixel 223 has been calculated. The divisor N(223) for pixel 233 can be calculated as N(223)=0+0+5+3=8. In the EDA(223), the pixel (pixel 243) directly below pixel 233 gets 5/8 of QER(233), the pixel (pixel 242) immediately to the left and directly below pixel 233 gets 3/8 of QER(233).

Still referring to FIG. 7, in some embodiments other than [7, 1, 5, 3], [$n_1$, $n_2$, $n_3$, $n_4$] may be determined to be any appropriate set of numbers. In some embodiments, not only the full pixels located at the four directions discussed above get allocated with some portion of the error, the full pixels located at other directions may also get some portion of the error. In some embodiments, not only the nearest neighboring full pixels are being quantized as discussed above, the one or more next nearest full pixels may also get quantized, thus there may be more than 4 error diffusion factors n. For example as shown in FIG. 7, full pixel 232 may also get a certain portion of QER(212) of the full pixel 212.

Referring to FIGS. 2 and 7, method proceeds to step 116 by deciding if all the full pixels have been quantized. In some embodiments, the error diffusion algorithm may scan the full pixels on GSD grid 150 from left to right, and from top to bottom, to quantize the adjusted values of all the full pixels one by one. In some examples, the error diffusion algorithm may scan pixels on GSD grid 150 along a serpentine path, for example, from left to right (e.g., pixel 212 to pixel 213), and then from right to left in the next row (e.g., pixel 223 to pixel 222).

At step 116, in some embodiments, if the next scanned full pixel has not been quantized, method 100 proceeds to step 110 to perform the second quantization process to the next full pixel. In some embodiments, the adjusted grey-level value $u_f(j)$ may be an adjusted grey-level value of a full pixel after being allocated with some portions of one or more second quantization errors (QERs) of one or more full pixels by the EDA discussed in step 114.

Referring to FIGS. 2 and 7, when it is determined that all the full pixels have been quantized, method 100 proceeds to step 118 by forming a second adjusted intensity map 600.

In some embodiments, the first and/or second quantization processes may include various functions, such as rounding, floor and/or ceiling.

By using error diffusion technique as discussed above, each time the quantization error is transferred to one or more neighboring pixels, while not affecting the pixels that have already been quantized. An error diffusion technique can make a digitization system be a more analog-like system. Error diffusion may result in such a way that the more pixels being rounded downwards, the more likely that the next pixel will be rounded upward. As an average, the quantization error may be close to zero. Error diffusion in the present disclosure may be able to enhance the contrast of patterns and improve CD uniformity and process window. In some embodiments, the second adjusted intensity map 600 may have an enhanced intensity and/or contrast.

The present disclosure provides many different embodiments of a method for image dithering. The method includes providing a polygon related to an integrated circuit (IC) layout design in a graphic database system (GDS) grid; converting the polygon to an intensity map in the GDS grid, the intensity map including a group of partial pixels and a group of full pixels; performing a first quantization process to a partial pixel to determine a first error; applying the first error to one or more full pixels; performing a second quantization process to a full pixel to determine a second error; and distributing the second error to one or more full pixels. The partial pixels correspond to pixels partially covered by the polygon, and the full pixels correspond to pixels fully covered by the polygon. The distributing the second error includes dividing the second quantization error using a divisor N; and distributing n1/N of the second quantization error to the immediately right unquantized pixel, n2/N of the second quantization error to the immediately right and directly below unquantized pixel, n3/N of second quantization error to the directly below unquantized pixel, and n4/N of second quantization error to the immediately left and directly below unquantized pixel. In the method, n1, n2, n3, or n4 equals to 0 when the unquantized pixel at a corresponding n1, n2, n3, or n4 direction is a partial pixel, and N=n1+n2+n3+n4.

In another embodiment, a method for image dithering includes providing an intensity map of an integrated circuit (IC) layout design. The intensity map includes one or more first pixels and one or more second pixels. The method includes performing a floor process to a first pixel; determining a quantization error by floor (QEF) of the first pixel; applying the QEF to a second pixel adjacent to the floored first pixel; performing a rounding process to a second pixel; determining a quantization error by rounding (QED) of the second pixel; and distributing the QED to one or more second pixels adjacent to the rounded second pixel.

In yet another embodiment, a method for image dithering includes providing an intensity map of an integrated circuit (IC) layout design. The intensity map includes one or more first pixels and one or more second pixels. The method includes performing a first dithering process to the first pixels by a computer; and performing a second dithering process to the second pixels by the computer. The first dithering process includes distributing a first error decided from a first quantization process to a second pixel adjacent to the currently quantized first pixel. The second dithering process includes distributing a second error decided from the second quantization process to one or more second pixels adjacent to the currently quantized second pixel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for image dithering, comprising:
providing a polygon related to an integrated circuit (IC) layout design in a graphic database system (GDS) grid;
converting the polygon to an intensity map in the GDS grid, the intensity map including a group of partial pixels corresponding to pixels partially covered by the polygon and a group of full pixels corresponding to pixels fully covered by the polygon;
performing a first quantization process to a partial pixel to one of n-bit discrete intensity levels to determine a first error;
applying the first error to one or more full pixels from among the group of full pixels while excluding pixels from among the group of partial pixels;
performing a second quantization process to a full pixel from among the group of full pixels to one of the n-bit discrete intensity levels to determine a second error; and
distributing the second error to one or more full pixels from among the group of full pixels while excluding pixels from among the group of partial pixels.

2. The method of claim 1, wherein the GDS grid includes a two-dimensional array of pixels.

3. The method of claim 1, wherein the first quantization process includes a floor process.

4. The method of claim 1, wherein the second quantization process includes a rounding process.

5. The method of claim 1, wherein the first error is determined by comparing a first continuous value of the partial pixel and a first discrete value, comprising one of the n-bit discrete intensity levels, of the partial pixel derived from the first quantization process.

6. The method of claim 1, wherein the second error is determined by comparing a second continuous value of the full pixel and a second discrete value, comprising one of the n-bit discrete intensity levels, of the full pixel derived from the second quantization process.

7. The method of claim 6, wherein the second continuous value is a continuous grey-level value of the full pixel.

8. The method of claim 6, wherein the second continuous value is derived from adjusting a continuous grey-level value of the full pixel using the first error of the partial pixel.

9. The method of claim 6, wherein the second continuous value of the full pixel is adjusted after the second quantization process of a different full pixel.

10. The method of claim 1, wherein the distributing the second error includes:
dividing the second error using a divisor N; and
distributing $n_1$/N of the second error to the immediately right unquantized pixel, $n_2$/N of the second error to the immediately right and directly below unquantized pixel, $n_3$/N of second error to the directly below unquantized pixel, and $n_4$/N of second error to the immediately left and directly below unquantized pixel,
wherein $n_1$, $n_2$, $n_3$, or $n_4$ equals to 0 when the unquantized pixel at a corresponding $n_1$, $n_2$, $n_3$, or $n_4$ direction is a partial pixel, and
wherein $N=n_1+n_2+n_3+n_4$.

11. The method of claim 1, further comprising:
deciding if all the full pixels have been quantized; and
forming an adjusted intensity map if all the full pixels have been quantized.

12. The method of claim 1, wherein the second quantization process is performed on the full pixels from left to right, and top to bottom.

13. The method of claim 1, wherein the second quantization process is performed on the full pixels along a serpentine path.

14. The method of claim 1, wherein the second error is applied to one or more full pixels adjacent to the currently quantized full pixel.

15. The method of claim 1, wherein the first error is applied to the one or more full pixels adjacent to the currently quantized partial pixel.

16. A method for image dithering, comprising:
providing an intensity map of an integrated circuit (IC) layout design, the intensity map including one or more first pixels corresponding to pixels partially covered by a polygon and one or more second pixels corresponding to pixels fully covered by the polygon;
performing a floor process to a first pixel, from among the one or more first pixels, to one of n-bit discrete intensity levels;
determining a quantization error by floor (QEF) of the first pixel;
applying the QEF to a second pixel, from among the one or more second pixels, adjacent to the floored first pixel while excluding the one or more first pixels;
performing a rounding process to a second pixel, from among the one or more second pixels, to one of the n-bit discrete intensity levels;
determining a quantization error by rounding (QED) of the second pixel; and
distributing the QED to one or more second pixels adjacent to the rounded second pixel while excluding the one or more first pixels.

17. The method of claim 16, wherein the distributing the QED includes:
dividing the second quantization error using a divisor N; and
distributing $n_1$/N of the second quantization error to the immediately right unquantized pixel, $n_2$/N of the second quantization error to the immediately right and directly below unquantized pixel, $n_3$/N of second quantization error to the directly below unquantized pixel, and $n_4$/N of second quantization error to the immediately left and directly below unquantized pixel,
wherein $n_1$, $n_2$, $n_3$, or $n_4$ equals to 0 when the unquantized pixel at a corresponding $n_1$, $n_2$, $n_3$, or $n_4$ direction is a partial pixel, and
wherein $N=n_1+n_2+n_3+n_4$.

18. A method for image dithering, comprising:
providing an intensity map of an integrated circuit (IC) layout design, the intensity map including one or more first pixels corresponding to pixels partially covered by a polygon and one or more second pixels corresponding to pixels fully covered by the polygon;
quantizing the one or more first pixels with a first quantization process to respective ones of n-bit discrete intensity levels by a computer;

performing a first dithering process of the one or more first pixels to at least one of the one or more second pixels while excluding the one or more first pixels by the computer;

quantizing the one or more second pixels with a second quantization process to respective ones of the n-bit discrete intensity levels by the computer; and performing a second dithering process of the one or more second pixels to at least one of the one or more second pixels while excluding the one or more first pixels by the computer.

19. The method of claim 18, wherein the first dithering process includes distributing a first error decided from the first quantization process to a second pixel of the one or more second pixels adjacent to the currently quantized first pixel.

20. The method of claim 18, wherein the second dithering process includes distributing a second error decided from the second quantization process to at least one of the one or more second pixels that are adjacent to the currently quantized second pixel.

* * * * *